May 13, 1969 W. H. WOOD ET AL 3,443,915

HIGH RESOLUTION PATTERNS FOR OPTICAL MASKS AND METHODS FOR THEIR FABRICATION

Filed March 26, 1965

WITNESSES

Theodore F. Wrobel

James F. Young

INVENTORS
William H. Wood
& Melvin H. Poston
BY Gordon H. Telfer
ATTORNEY

United States Patent Office 3,443,915
Patented May 13, 1969

3,443,915

HIGH RESOLUTION PATTERNS FOR OPTICAL MASKS AND METHODS FOR THEIR FABRICATION

William H. Wood, Good Hope, Rockbridge, Ohio, and Melvin H. Poston, Annapolis, Md., assignors to Westinghouse Electric Corporation, Pittsburgh, Pa., a corporation of Pennsylvania Filed Mar. 26, 1965, Ser. No. 442,921
Int. Cl. B44d *1/12;* C03c *17/00*
U.S. Cl. 29—194 2 Claims

ABSTRACT OF THE DISCLOSURE

High resolution optical masks, and methods of forming them, are provided wherein a continuous conductive layer is first deposited on a transparent support and an opaque pattern is formed by plating or deposition through a subsequently removed photoresist pattern.

Figure 1:
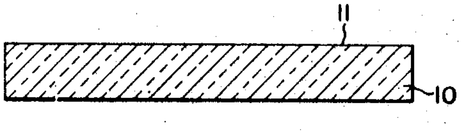

This invention relates generally to highly precise patterns for optical purposes and, more particularly, to optical masks of a metallic material on an insulating member suitable for use in the production of highly precise microelectronic components.

In the production of semiconductor devices, integrated circuits and thin film microelectronic elements one of the most frequently required types of operations is the formation of suitable masks on a substrate for the selective deposition or removal of materials. Merely as an example, the selective diffusion of impurities into a body of semiconductor material requires the formation of a mask impervious to the doping material. Silicon dioxide is often used where the semiconductive material is silicon. The oxide pattern is formed using photoresist and etching techniques requiring a master mask for exposing the photoresist in the desired pattern. In the past, the most widely used type of master mask has been a photographic negative or positive generally consisting of particles of silver in a gelatin layer. As the art of microelectronic fabrication advances, there is continual demand for increasingly better resolution of the patterns formed on the microelectronic elements and hence the requirement for more precise and better resolution master masks.

Using photographic emulsions is not fully satisfactory because the image is always as thick as the emulsion and thus will not cast a perfectly sharp shadow. Also, the emulsion is easily scratched by dust particles and rough surfaces where used in contact printing that leads to pinholing and to other difficulties such as broken images which is where isolated areas within a pattern appear in the resist as being connected due to a scratch or scar diffracting the light of exposure into the photosensitive resist.

In attempting to solve these problems in order to fabricate microelectronic elements with greater precision there have been advanced proposals for the utilization of an optical mask comprising a solid transparent substrate such as one of glass with a thin metal film pattern disposed on the glass surface. While some success has been achieved in the fabrication of metal pattern on glass as have been long used as scales in optical instruments, for example, continued improvement is desired in precision, ease of formation and durability.

It is therefore an object of the present invention to provide improved optical masks, and methods of making them, having high resolution and long life.

Another object is to provide improved optical masks, and methods of making them, that are of uniform quality.

The invention achieves the above-mentioned and additional objects and advantages by methods of fabrication that include first depositing a layer of conductive material continuously on the surface of the transparent support member and performing additional operations thereon including the deposition of additional material so as to form the desired mask pattern. More particularly, the invention contemplates the use of an initial continuous layer of transparent conductive material. In the preferred form of the invention a pattern of a non-conductive material is formed upon the transparent layer, such as by a photoresist, and an opaque layer of material deposited on at least the exposed portions of the transparent layer so that removal of the pattern of non-conductive material results in the desired mask and the transparent layer may remain continuous on the support member.

It has been found, and it is in large part from this discovery that the present invention results, that a layer of metal deposited on a transparent surface offers qualities of continuity and adherence so that subsequent material deposited thereon by any of the known techniques, such as plating or evaporation, forms a more continuous and uniformly opaque pattern. Furthermore, present indications are that the methods in accordance with this invention can form thinner mask patterns (less than about 1000 angstroms) and hence, provide better resolution than known techniques such as etching (typically 2500 to 5000 angstroms thick).

Figure 6:
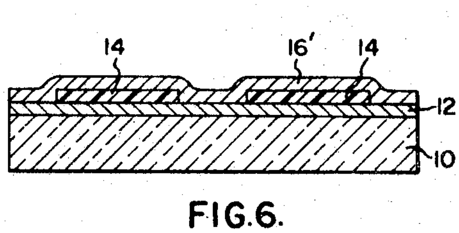

The present invention, together with the above-mentioned and additional objects and advantages thereof will be better understood by reference to the following description taken with the accompanying drawing wherein:

FIGURES 1 to 5 are successive views, in cross section, of an optical mask in various stages of a fabrication process in accordance with one embodiment of the present invention; and FIG. 6 is a cross sectional view of an optical mask during fabrication in accordance with another embodiment of the present invention.

FIG. 1 illustrates a support member 10 that is of suitable transparent material such as glass, quartz or ceramic. At least its upper surface 11 should be thoroughly cleaned as by the utilization of one of the known glass cleaning techniques. For example, the substrate 10 may be cleaned by immersing it in conventional chromic acid glass cleaning solution heated to about 75° C., rinsing in deionized water and air drying. The surface 11 may be, but is not necessarily, also treated with solutions containing surfactants (wetting agents), such as amino or silane compounds, either before, during or after the cleaning operation.

Figure 2:
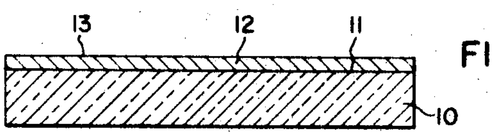

FIG. 2 shows the support member 10 after there has been deposited on the upper surface 11 a continuous layer 12 of conductive material that is in accordance with the preferred forms of the invention continuous and pinhole free yet so thin that it is transparent.

It is to be understood that transparent elements (such as support member 10 and film 12) are at least transmissive of the radiation with which they will be used. That is, for the exposure of conventional photoresist materials they should be transmissive of radiation in the portion of the spectrum to which the photoresist is sensitive, often called actinic radiation. The upper limit of thickness depends on the wavelength of light to be used with the completed mask. For example, highly pure chromium films less than about 200 angstrom units thick were very successful for use with light in the .35 micron range. While considerable success has been achieved in the formation of such layers by vacuum evaporation it is also suitable to deposit the layer by other means such as by sputtering pyrolytic decomposition deposition or electroless chemical deposition. These latter techniques have been found to form films having some discontinuities or pinholes that are not preferred but may, however, be tolerable in some applications.

Figure 3:
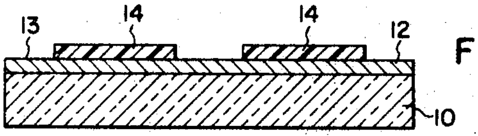

FIG. 3 shows the structure after there has been formed on the free surface 13 of the transparent conductive layer 12 a pattern of non-conductive material 14 that is a negative representation of the opaque image that is desired in the ultimate mask. The pattern of non-conductive material may conveniently be of a photoresist material of the common commercially available types processed in known manner. For example, a photoresist material may be used that becomes insoluble in the portions exposed. Such material would be applied in a layer and exposed through an optical mask that is a positive representation of the ultimate mask pattern. A suitable photoresist material of this type is that available as KMER from the Eastman Kodak Company. Alternatively, a photoresist material may be used which becomes soluble where exposed. A layer of it applied to the surface would be exposed through an optical mask that is a negative representation of the ultimate pattern. The material available as AZ Photo Resist from Shipley Company, Inc., Wellesley, Mass., is an example of this latter type.

Figure 4:
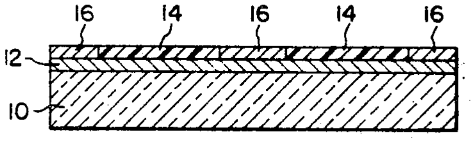

FIG. 4 shows the structure after there has been deposited on the exposed areas of the transparent layer 12 a layer 16 that is sufficiently thick to be opaque. The layer 16 is preferably plated onto the layer 12 such as by using the mask structure as the cathode in an electrolytic plating bath with a nickel anode and an electrolyte of nickel sulfamate in water. To improve the adherence and continuity of the plated metal, it is often preferable that the transparent film 12 include a layer of gold, such as on a layer of chromium.

Figure 5:
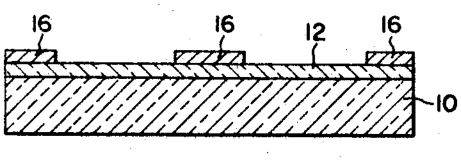

FIG. 5 shows the structure after the photoresist or non-conductive pattern has been removed to leave the opaque material 16 deposited on the transparent layer 12 remaining. The removal of the photoresist material may be effected by using a solvent to which it is soluble preferably with ultrasonic agitation. For example, one preferred method with the use of KMER photoresist is an ultrasonic bath containing acetone at room temperature.

The pattern that is formed as shown in FIG. 5 is heat treated for continuity and strength in air at a temperature of from about 300° C. to about 400° C. for at least 30 minutes.

FIG. 6 shows an alternate stage in the fabrication process that may be employed instead of that illustrated in FIG. 4. Here the opaque layer of metal 16' is deposited over the non-metallic pattern 14 as well as on the exposed portions of the transparent conductive material 12. This operation may be performed by vacuum evaporation or any one or more of the techniques mentioned above in connection with the formation of layer 12. Removal of the photoresist mask leaves the opaque conductive pattern 16 of FIG. 5 remaining.

As the film 12 need only be transmissive of radiation in the actinic portion of the spectrum (about 2500 angstroms to 5000 angstroms), it may be of materials that provide that quality and are opaque to other spectral radiation that merely generates heat in the photoresist film to be exposed and results in loss of resolution. Silver is an advantageous material for this purpose as it is transmissive to actinic radiation and opaque to adjacent portions of the spectrum.

The metals preferred for use in the practice of the present invention are the following:

| | |
|---|---|
| Layer **12** | Chromium, tantalum, or titanium on the support **10** with, at least where layer **16** is plated, an additional layer of gold, nickel or copper. |
| Layer **16**, FIG. 4 | Nickel or copper. |
| Layer **16'**, FIG. 6 | Chromium or nickel. |

For ease of application and uniformity, substantially pure metals are usually preferred. Mixtures of two or more elemental metals in a single layer are also within the scope of the invention. For example, the layer 16' of vapor deposited material in FIG. 6 may be formed of one of the several commercially available nickel-chromium alloys.

For best resolution, the opaque pattern should be as thin as possible. It is found in the practice of this invention that sufficient opacity can be achieved in patterns having a thickness of less than about 1000 angstroms.

What is claimed is:

1. An optical mask comprising: a radiation transmissive support member; a continuous, radiation transmissive, layer of conductive material comprising at least a first portion on said support member of metal consisting essentially of at least one member selected from the group consisting of chromium, tantalum and titanium and a second portion on said first portion of metal consisting essentially of at least one member selected from the group consisting of gold, nickel, and copper; and an opaque pattern of metal disposed on said radiation transmissive layer of conductive material.

2. An optical mask in accordance with claim 1 wherein: said opaque pattern is of metal consisting essentially of at least one member selected from the group consisting of nickel and copper.

References Cited

UNITED STATES PATENTS

| | | | |
|---|---|---|---|
| 2,894,854 | 7/1959 | MacIntyre et al. | 117—71 X |
| 3,075,866 | 1/1963 | Baker et al. | |
| 2,799,600 | 7/1957 | Scott | 117—217 X |
| 2,904,765 | 9/1959 | Seehof et al. | |
| 2,995,461 | 8/1961 | Boicey et al. | 117—5.5 |
| 3,042,591 | 7/1962 | Cado | 29—625 |
| 3,090,706 | 5/1963 | Cado | 117—212 |
| 3,310,432 | 3/1967 | Griest et al. | 117—5.5X |

FOREIGN PATENTS

| | | |
|---|---|---|
| 863,850 | 3/1961 | Great Britain. |

ALFRED L. LEAVITT, *Primary Examiner.*

C. K. WEIFFENBACH, *Assistant Examiner.*

U.S. Cl. X.R.

117—45, 71, 124, 211, 212, 217, 221; 29—195, 198, 199